United States Patent
Kuo et al.

(10) Patent No.: US 11,978,712 B2
(45) Date of Patent: May 7, 2024

(54) METHOD OF FORMING SEMICONDUCTOR PACKAGE TRANSMISSION LINES WITH MICRO-BUMP LINES

(71) Applicant: Taiwan Semiconductor Manufacturing Co., Ltd., Hsinchu (TW)

(72) Inventors: Chin-Wei Kuo, Zhubei (TW); Hsiao-Tsung Yen, Tainan (TW); Min-Chie Jeng, Taipei (TW); Yu-Ling Lin, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 194 days.

(21) Appl. No.: 17/098,602

(22) Filed: Nov. 16, 2020

(65) Prior Publication Data

US 2021/0082848 A1 Mar. 18, 2021

Related U.S. Application Data

(60) Continuation of application No. 16/390,218, filed on Apr. 22, 2019, now Pat. No. 10,840,201, which is a
(Continued)

(51) Int. Cl.
*H01L 21/768* (2006.01)
*H01L 21/56* (2006.01)
(Continued)

(52) U.S. Cl.
CPC ............ *H01L 24/11* (2013.01); *H01L 21/563* (2013.01); *H01L 23/49811* (2013.01);
(Continued)

(58) Field of Classification Search
CPC ............... H01L 23/49827; H01L 22/32; H01L 2224/16; H01L 2224/13025; H01L 23/49822; Y10T 29/49004
See application file for complete search history.

(56) References Cited

U.S. PATENT DOCUMENTS

| 4,939,568 A | 7/1990 | Kato et al. |
| 5,726,502 A * | 3/1998 | Beddingfield .......... H01L 24/13 |
| | | 257/E23.179 |

(Continued)

FOREIGN PATENT DOCUMENTS

| CN | 1945817 | 4/2007 |
| CN | 102027633 A | 4/2011 |

(Continued)

OTHER PUBLICATIONS

Nomiyama, Y. et al., "Low-Impedance and High-Q Transmission Line for mmw VCO," IEEE Workshop on Signal Propagation on Interconnects, 2009, SPI 09, Department of Physical Electronics, Tokyo Institute of Technology, 4 pages.

(Continued)

*Primary Examiner* — Marcos D. Pizarro
*Assistant Examiner* — Tenley H Schofield
(74) *Attorney, Agent, or Firm* — Slater Matsil, LLP (57) ABSTRACT

Methods and apparatus for forming a semiconductor device package with a transmission line using a micro-bump layer are disclosed. The micro-bump layer may comprise micro-bumps and micro-bump lines, formed between a top device and a bottom device. A signal transmission line may be formed using a micro-bump line above a bottom device. A ground plane may be formed using a redistribution layer (RDL) within the bottom device, or using additional micro-bump lines. The RDL formed ground plane may comprise open slots. There may be RDLs at the bottom device and the
(Continued)

top device above and below the micro-bump lines to form parts of the ground planes.

20 Claims, 10 Drawing Sheets

Related U.S. Application Data division of application No. 14/875,448, filed on Oct. 5, 2015, now Pat. No. 10,269,746, which is a continuation of application No. 13/750,814, filed on Jan. 25, 2013, now Pat. No. 9,171,798.

(51) Int. Cl.
| | |
|---|---|
| H01L 23/00 | (2006.01) |
| H01L 23/31 | (2006.01) |
| H01L 23/367 | (2006.01) |
| H01L 23/495 | (2006.01) |
| H01L 23/498 | (2006.01) |
| H01L 23/522 | (2006.01) |
| H01L 23/525 | (2006.01) |
| H01L 23/528 | (2006.01) |
| H01L 23/532 | (2006.01) |
| H01L 23/66 | (2006.01) |
| H01L 25/065 | (2023.01) |
| H01P 5/02 | (2006.01) |

(52) U.S. Cl.
CPC .... *H01L 23/49822* (2013.01); *H01L 23/5225* (2013.01); *H01L 23/525* (2013.01); *H01L 23/66* (2013.01); *H01L 24/16* (2013.01); *H01L 24/81* (2013.01); *H01L 25/0657* (2013.01); *H01L 23/53223* (2013.01); *H01L 23/53238* (2013.01); *H01L 23/53257* (2013.01); *H01L 23/5329* (2013.01); *H01L 2223/6627* (2013.01); *H01L 2924/0002* (2013.01); *H01L 2924/01028* (2013.01); *H01L 2924/01029* (2013.01); *H01L 2924/014* (2013.01); *H01P 5/028* (2013.01); *Y10T 29/49124* (2015.01)

(56) References Cited

U.S. PATENT DOCUMENTS

| | | | |
|---|---|---|---|
| 6,404,062 B1 | 6/2002 | Taniguchi et al. | |
| 6,501,169 B1 | 12/2002 | Aoki et al. | |
| 6,614,325 B1 | 9/2003 | Kocin | |
| 6,727,118 B2 | 4/2004 | Lasky et al. | |
| 6,879,492 B2 | 4/2005 | Alcoe et al. | |
| 7,145,411 B1 | 12/2006 | Blair et al. | |
| 7,402,901 B2 | 7/2008 | Hatano et al. | |
| 7,619,489 B2 | 11/2009 | Mizuno | |
| 7,759,212 B2 | 7/2010 | Lin et al. | |
| 7,977,783 B1 | 7/2011 | Park et al. | |
| 8,013,449 B2 | 9/2011 | Lin et al. | |
| 8,138,857 B2 | 3/2012 | Ding et al. | |
| 8,227,904 B2 | 7/2012 | Braunisch et al. | |
| 8,279,025 B2 | 10/2012 | Cho | |
| 8,358,009 B2 | 1/2013 | Furumiya et al. | |
| 8,896,094 B2 | 11/2014 | Yen et al. | |
| 9,000,586 B2 | 4/2015 | Do et al. | |
| 9,035,457 B2 | 5/2015 | Lin et al. | |
| 9,041,215 B2 | 5/2015 | Yu et al. | |
| 9,064,705 B2 | 6/2015 | Lu et al. | |
| 9,087,840 B2 | 7/2015 | Lin et al. | |
| 9,159,650 B2 | 10/2015 | Yoshioka et al. | |
| 9,198,284 B2 * | 11/2015 | Sakuma | H05K 1/111 |
| 10,269,746 B2 * | 4/2019 | Kuo | H01L 23/49822 |
| 2003/0038331 A1 | 2/2003 | Aoki et al. | |
| 2003/0060035 A1 * | 3/2003 | Kimura | H01L 23/50 |
| | | | 257/E23.079 |
| 2003/0193078 A1 | 10/2003 | Chungpaiboonpatana et al. | |
| 2004/0026782 A1 | 2/2004 | Anzai | |
| 2004/0089946 A1 | 5/2004 | Wen | |
| 2004/0155728 A1 * | 8/2004 | Cheung | H01P 3/003 |
| | | | 333/161 |
| 2005/0006760 A1 | 1/2005 | Terui | |
| 2005/0017357 A1 * | 1/2005 | Iida | H01L 23/49827 |
| | | | 257/E23.079 |
| 2005/0176233 A1 | 8/2005 | Joshi et al. | |
| 2005/0233571 A1 | 10/2005 | Tao et al. | |
| 2006/0079025 A1 | 4/2006 | Kripesh et al. | |
| 2007/0080416 A1 | 4/2007 | Yoshioka et al. | |
| 2007/0096313 A1 * | 5/2007 | Chou | H01L 24/05 |
| | | | 257/737 |
| 2007/0241844 A1 | 10/2007 | Kim et al. | |
| 2008/0054460 A1 | 3/2008 | Hung | |
| 2008/0079103 A1 | 4/2008 | Liao | |
| 2008/0111253 A1 | 5/2008 | Salzman | |
| 2008/0293232 A1 * | 11/2008 | Kang | H05K 3/303 |
| | | | 257/737 |
| 2009/0166849 A1 * | 7/2009 | Jao | H01L 23/4334 |
| | | | 257/E21.507 |
| 2009/0170242 A1 | 7/2009 | Lin et al. | |
| 2009/0236738 A1 * | 9/2009 | Shim | H05K 3/3452 |
| | | | 257/737 |
| 2009/0249610 A1 | 10/2009 | Ding et al. | |
| 2009/0283905 A1 | 11/2009 | Huang et al. | |
| 2009/0315633 A1 | 12/2009 | Ding et al. | |
| 2009/0321948 A1 | 12/2009 | Wang et al. | |
| 2010/0214041 A1 | 8/2010 | Cho | |
| 2012/0018885 A1 | 1/2012 | Lee et al. | |
| 2012/0077314 A1 | 3/2012 | Park et al. | |
| 2012/0126417 A1 | 5/2012 | Chiu | |
| 2013/0107484 A1 * | 5/2013 | Sakuma | H05K 1/0296 |
| | | | 361/768 |
| 2013/0200511 A1 | 8/2013 | Banijamali | |

FOREIGN PATENT DOCUMENTS

| | | |
|---|---|---|
| JP | 10022449 | 1/1998 |
| JP | 11195730 | 7/1999 |
| JP | 2000235979 | 8/2000 |
| JP | 2001156209 A | 6/2001 |
| JP | 2004079579 | 3/2004 |
| JP | 2004266117 | 9/2004 |
| JP | 2005032782 | 2/2005 |
| JP | 2007103848 | 4/2007 |
| JP | 2007123740 | 5/2007 |
| JP | 2007134359 | 5/2007 |
| JP | 2008103387 | 5/2008 |
| JP | 2009218841 | 9/2009 |
| KR | 10-2006-0100263 | 9/2006 |
| KR | 20120014952 | 2/2012 |
| KR | 10-2012-0018810 | 3/2012 |
| KR | 10-2012-0032254 | 4/2012 |

OTHER PUBLICATIONS

Tesson, Oliver et al., "Electro-Magnetic Modeling and Design of Through Silicon Vias Based Passive Interposers for High Performance Applications up to the V-Band," International Journal on Advances in Systems and Measurements, vol. 5, No. 1 & 2, 2012, http://www.iariajournals.org/systems_and_measurements/.

Veenstra, H. et al., "60GHz VCOs with Transmission Line Resonator in a 0.25 µm SiGe BiCMOS Technology," IEEE Radio Frequency Integrated Circuits Symposium 2008, Philips Research, Eindhoven, The Netherlands, pp. 119-122.

* cited by examiner

METHOD OF FORMING SEMICONDUCTOR PACKAGE TRANSMISSION LINES WITH MICRO-BUMP LINES

This application is a continuation application of U.S. application Ser. No. 16/390,218, filed Apr. 22, 2019, now U.S. Pat. No. 10,840,201, entitled "Methods and Apparatus for Transmission Lines in Packages," which is a divisional application of U.S. application Ser. No. 14/875,448, filed Oct. 5, 2015, now U.S. Pat. No. 10,269,746, entitled "Methods and Apparatus for Transmission Lines in Packages," which is a continuation application of U.S. application Ser. No. 13/750,814, filed Jan. 25, 2013, now U.S. Pat. No. 9,171,798, entitled "Methods and Apparatus for Transmission Lines in Packages," each application is incorporated herein by reference.

BACKGROUND

Electronics can be divided into a simple hierarchy consisting of devices such as integrated circuit (IC) chips, packages, printed circuit boards (PCB), and systems. The package is the interface between an IC chip and a PCB. IC dies are made from semiconductor materials such as silicon. Dies are then assembled into semiconductor packages such as quad flat packs (QFP), pin grid arrays (PGA), ball grid arrays (BGA), three dimensional integrated circuits (3DIC), wafer level packages (WLP), or package on package (PoP) devices, using wire bonding (WB), tape automated bonding (TAB), or flip chip (FC) bumping assembly techniques. The packaged die is then attached either directly to a PCB or to another substrate as the second level packaging.

3DIC technologies are known as vertical interconnect packaging technologies as they exploit the vertical dimension of the chip to reduce interconnect length and to achieve greater integration efficiency. The techniques for 3DIC package include wire-bonding, micro-bumps, through-vias, and more. A silicon interposer can be used to form a 3DIC package, where the interposer provides die-to-die interconnections for dies mounted on the interposer. For example, two dies may be bonded above each other by face-to-face or face-to-back stacking, with the lower die being coupled to the interposer by connectors such as micro-bumps. Alternatively, multiple dies may also be mounted in parallel above an interposer, and coupled to the interposer by connectors such as micro-bumps.

Semiconductor packages equipped with wireless data and communication systems comprise various RF (radio frequency) transmitting structures, which sometimes are built on chip or in-package. Electromagnetic RF waves or signals are conveyed through the packages or devices by conductive structures referred to as transmission lines. Transmission lines, as an example, may be used for interconnecting individual electrical elements together in a Monolithic Microwave Integrated Circuit (MMIC), and for interconnecting MMICs together within microwave Multi Chip Modules (MCMs).

In general, a transmission line includes at least two electric conductors or lines wherein one of the lines forms a ground (also referred to as "ground plane") and the other forms a signal transmission line. The signal transmission line is variously arranged and combined with one or more ground planes or ground lines to form different types of conductive transmission lines such as microstrip, coplanar waveguide (CPW), grounded coplanar waveguide (GCPW) transmission lines to serve various RF signal applications. The signal transmission lines and ground conductors or planes are generally supported by some type of insulating substrate or material such as a dielectric.

As semiconductor technology continues to advance and chip package size shrinks, such as by employing 3DIC die stacking, the distance between metal layers in the conductive CMOS (complementary metal-oxide semiconductor) structure becomes smaller, leading to increasingly larger capacitance between the metal layers and reduced performance of RF devices. In addition, designing and fabricating transmission lines on-chip in a single chip or die becomes increasingly difficult with shrinking die packages in advanced semiconductor manufacturing technology nodes like the 20 nm process. Methods and apparatus are needed for designing and fabricating transmission lines with improved performance.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1(*a*)-1(*f*) illustrate cross-sectional views and a top view of microstrip transmission lines formed within a package using a micro-bump layer, in accordance with some embodiments;

FIGS. 2(*a*)-2(*e*) illustrate cross-sectional views and a three dimensional view of coplanar waveguide (CPW) transmission lines formed within a package using a micro-bump layer, in accordance with some additional embodiments; and FIGS. 3(*a*)-3(*d*) illustrate cross-sectional views and a three dimensional view of grounded coplanar waveguide (GCPW) transmission lines formed within a package using a micro-bump layer, in accordance with some embodiment.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the embodiments of the present disclosure provide many applicable concepts that can be embodied in a wide variety of specific contexts. The specific embodiments discussed are merely illustrative of specific ways to make and use the disclosure, and do not limit the scope of the disclosure.

As will be illustrated in the following, methods and apparatus for forming a semiconductor device package with transmission lines using a micro-bump layer are disclosed. The micro-bump layer may comprise micro-bumps and micro-bump lines, formed between a top die and a bottom die, or between a die and an interposer. A signal transmission line may be formed using a micro-bump line above a device. A ground plane may be formed using a redistribution layer (RDL) within a device, or using additional micro-bump lines. The RDL formed ground plane may comprise open slots. There may be RDLs at a bottom device and top device above and below the micro-bump lines to form parts of the ground planes. Transmission lines so formed have lower resistance, and save the areas occupied by the transmission lines.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"— when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1A:
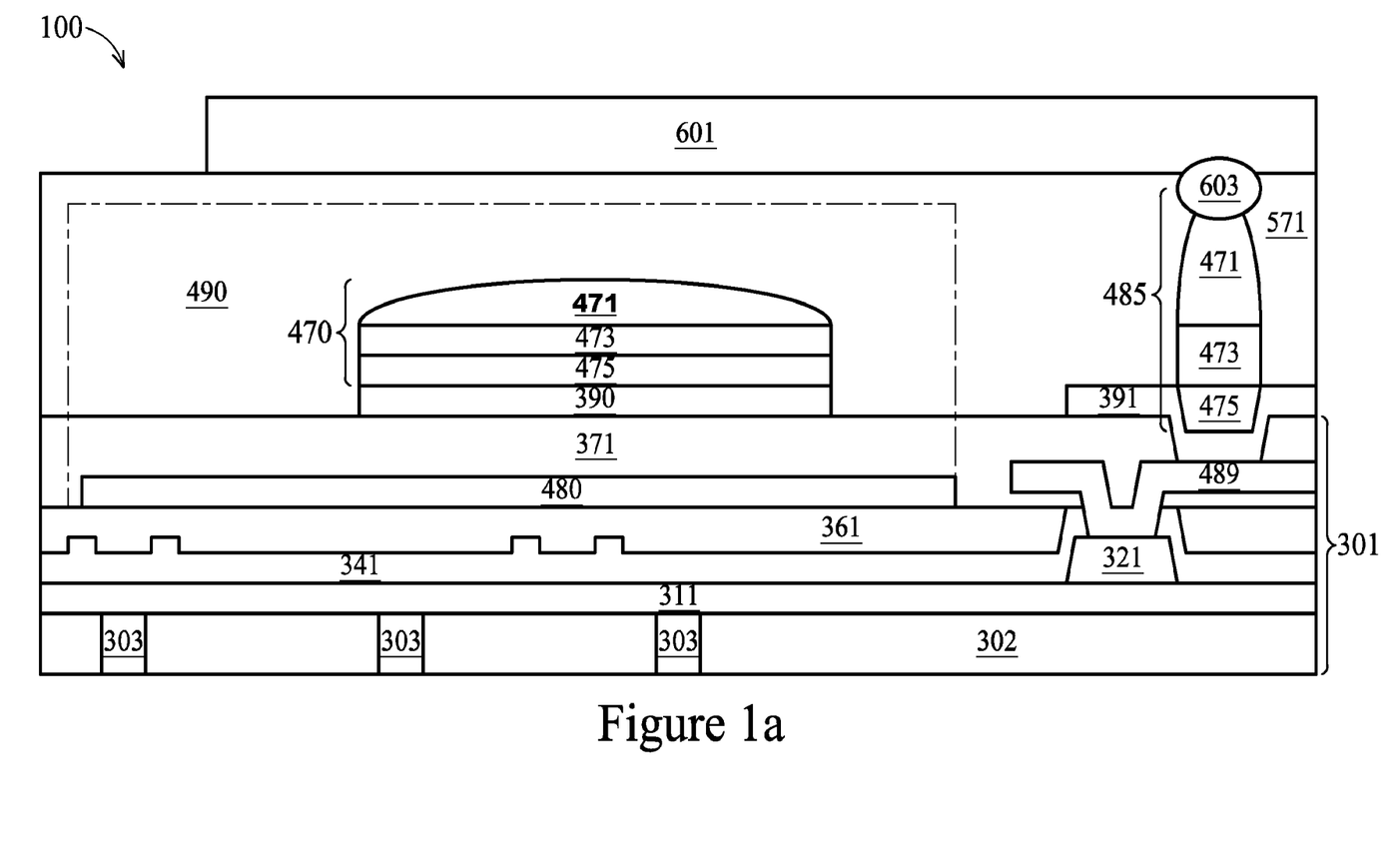

FIG. 1(a) illustrates a cross-sectional view of a microstrip transmission line formed within a package using a micro-bump layer, in accordance with some embodiment. In general, a microstrip transmission line comprises a signal transmission line made of a thin flat conductor and a ground plane, where the signal transmission line is in parallel to the ground plane, separated from the ground plane by some type of insulating substrate or material such as a dielectric.

As illustrated in FIG. 1(a), a semiconductor device package 100 comprising a transmission line 490 may be formed on a device 301. The device 301 may comprise: a substrate 302 with through vias (TV) 303, a dielectric layer 311, a plurality of contact pads 321, a passivation layer 341, an insulator layer 361, a redistribution layer (RDL) comprising segments 480 and 489, another insulator layer 371, and an under bump metal (UBM) layer comprising UBM pad 391 covering openings of the insulator layer 371, and UBM line 390 above the insulator layer 371 in parallel to the RDL segment 480, or simply referred as RDL 480. A micro-bump layer may be formed above the device 301. The micro-bump layer comprises micro-bump line 470 on the UBM line 390 in parallel to the RDL 480, and a micro-bump 485 placed on the UBM pad 391, which is further connected to the RDL 489 inside the device 301. A die 601 may be placed above the device 301, connected to the micro-bump 485 by connectors 603. An underfill 571 may fill the gap between the device 301 and the die 601, covering the micro-bump line 470, the micro-bump 485, and connectors 603. Each of these structures is discussed in greater detail in the following paragraphs.

The RDL 480, the micro-bump line 470 separated from the RDL 480 by the insulator layer 371, and the UBM line 390 under the micro-bump line 470 form the transmission line 490, where the RDL 480 is the ground plane, and the micro-bump line 470 and the UBM line 390 form the signal transmission line. In some alternative embodiments, the UBM line 390 may not exist and the micro-bump line 470 alone is placed on the insulator layer 371 to act as the signal transmission line.

The device 301 may be an interposer comprising a substrate, with through vias formed within the substrate, and a plurality of contact pads, passivation layers, insulator layers, RDLs, and a UBM layer. Alternatively, the device 301 may be a part of a chip or an integrated circuit (IC) die, which may be a back or front side of a die. When the device 301 is a part of a die, the die 601 is placed on the IC device 301, which will be further coupled to an interposer by connectors such as micro-bumps to form a package such as a 3DIC package. In the case when the device 301 is a part of a die, it may be called as a bottom die, and the die 601 may be called a top die. When the device 301 is the back of a die, then the package 100 is formed by face-to-back stacking of the dies 301 and 601. When the device 301 is the front side of a die, then the package 100 is formed by face-to-face stacking of the dies 301 and 601. Alternatively, the device 301 may be a package substrate without through vias, any or all of the layers described above. These devices and any other suitable devices may alternatively be used and are fully intended to be included within the scope of the present embodiments.

The substrate 302 for the device 301 may be, e.g., a silicon substrate, doped or undoped, or an active layer of a silicon-on-insulator (SOI) substrate, used to provide support for the device 301. However, the substrate 302 may alternatively be a glass substrate, a ceramic substrate, a polymer substrate, or any other substrate that may provide a suitable protection and/or interconnection functionality. These and any other suitable materials may alternatively be used for the substrate 302. There may be a plurality of active or passive components, such as transistors, capacitors, resistors, and the like, formed within the substrate 302, which are not shown in FIG. 1(a). As one of ordinary skill in the art will recognize, a wide variety of active or passive components may be used to generate the desired structural and functional requirements of the design for the device 301.

A plurality of TVs 303 may be formed through the substrate 302. The TVs 303 may be formed by applying and developing a suitable photoresist, and then etching the substrate 302 to generate TV openings. The openings for the TVs 303 may be formed to extend into the substrate 302 to a depth at least greater than the eventual desired height. Accordingly, the depth may be between about 1 µm and about 700 µm below the surface on the substrate 302. The openings for the TVs 303 may have a diameter of between about 1 µm and about 100 µm. Then the openings for the TVs 303 may be filled by a barrier layer and a conductive material, using a process such as chemical vapor deposition (CVD) process, plasma enhanced CVD (PECVD), sputtering or metal organic chemical vapor deposition (MOCVD). Excessive barrier layer and excessive conductive material outside of the openings for the TVs 303 may be removed through a grinding process such as chemical mechanical polishing (CMP). Afterwards, a thinning of the second side of the substrate 302 may be performed by a planarization process such as CMP or etching, in order to expose the openings for the TVs 303 and to form the TVs 303 from the conductive material that extends through the substrate 302. A dielectric layer 311 may be formed on the substrate 302. The dielectric layer 311 may be a representation of a plurality of sub-layers such as inter-metal dielectric layers with various metal layers embedded.

A plurality of contact pads 321 may be formed on the dielectric layer 311. Contact pads 321 may be made with aluminum (Al), copper (Cu), tin (Sn), nickel (Ni), gold (Au), silver (Ag), or other electrically conductive material. The deposition of contact pads 321 uses an electrolytic plating, sputtering, physical vapor deposition (PVD), or electroless plating process. The size, shape, and location of the contact pads 321 are only for illustration purposes and are not limiting. The plurality of contact pads 321 may be of the same size or of different sizes.

A passivation layer 341 may be formed over the substrate 302, the dielectric layer 311, and above the contact pads 321 for structural support and physical isolation. The passivation layer 341 may be made with silicon nitride (SiN), silicon dioxide (SiO2), silicon oxynitride (SiON), polyimide (PI), benzocyclobutene (BCB), polybenzoxazole (PBO), or other insulating material. Openings of the passivation layer 341 may be made by removing a portion of the passivation layer 341 using a mask-defined photoresist etching process to expose the contact pads 321. The size, shape, and location of the openings made are only for illustration purposes and are not limiting.

An insulator layer 361, such as a polymer layer 361, may be formed over the passivation layer 341 and over the passivation layer opening to cover the contact pads 321. An opening of the insulator layer 361 may be formed to expose the contact pads 321. The openings of the insulator layer 361 may be made by removing a portion of the insulator layer 361 using a mask-defined photoresist etching process to expose the contact pads 321. The size, shape, and location of the opening made are only for illustration purposes and are not limiting.

The RDLs 480 and 489 may be formed above the insulator layer 361. The RDL 489 may cover the exposed contact pads 321, while the RDL 480 may not be connected to any contact or conductor within the insulator layers 361 or 371. Instead, the RDL 480 acts as a ground plane for the transmission line 490. While illustrated in FIG. 1(a) as a single layer of dielectric and interconnects, the RDLs 480 and 489 may be formed of alternating layers of dielectric and conductive material and may be formed through any suitable process (such as deposition, damascene, dual damascene, etc.). The RDLs 480 and 489 may be made with, e.g., Al, Cu, or a Cu alloy. The RDLs 480 and 489 can be made by an electrolytic plating, sputter, PVD, or electroless plating process. The RDLs 480 and 489 can be made with a single layer, or multiple layers using an adhesion layer of Ti, TiW, TaN, Ta or Cr, for example. The device 301 may comprise a number of RDL layers to form a network of inter-level interconnects according to the function of the semiconductor device.

Another insulator layer 371 may be formed on the RDLs 480 and 489, which may be the top layer and surface layer of the device 301. An opening of the insulator layer 371 may be formed to expose the RDL 489 while the RDL 480 may be covered by the insulator layer 371. The openings of the insulator layer 371 may be made by removing a portion of the insulator layer 371 using a mask-defined photoresist etching process to expose the RDL 489. The size, shape, and location of the opening made are only for illustration purposes and are not limiting. The insulator layer 371 may be formed of a polymer, such as an epoxy, polyimide, benzocyclobutene (BCB), polybenzoxazole (PBO), and the like, although other relatively soft, often organic, dielectric materials can also be used. Formation methods include spin coating or other commonly used methods. The thickness of the insulator layer 371 may be between about 5 µm and about 30 µm, for example. The dimensions recited throughout the description are merely examples, and will change with the down-scaling of integrated circuits.

An UBM layer may comprise an UBM pad 391 and an UBM line 390. The UBM pad 391 may be formed around the opening of the insulator layer 371 and connected to the RDL 489. The UBM line 390 is formed in parallel to the RDL 480, and separated from the RDL 480 by the insulator layer 371. The UBM pad 391 and UBM line 390 may be formed of copper or copper alloys, which may include silver, chromium, nickel, tin, gold, and combinations thereof. Additional layers, such as a nickel layer, a lead-free pre-solder layer, or the combinations thereof, may be formed over the copper layer. The UBM pad 391 and UBM line 390 may have a thickness of between about 1 µm and about 20 µm. The UBM pad 391 may be called a contact pad as well.

The device 301 described above may merely be an example of an embodiment. There may be many other variations different from what is illustrated in FIG. 1(a) and described above. For example, the insulator layer 361 may not present in some of the embodiments, or there may be multiple passivation layers 341 in some embodiments. The device 301 may have only a RDL contained in an insulator layer.

The die 601 may be packaged with the device 301 through the micro-bump layer, while the gap between the die 601 and the device 301 is covered by an underfill 571. The die 601 is connected to the connectors 603, which are placed on the micro-bump 485 within the micro-bump layer.

Connectors 603 may be used to provide connections between the micro-bump 485 and the die 601. The connectors 603 may be contact bumps such as micro-bumps or controlled collapse chip connection (C4) bumps and may comprise a material such as tin, or other suitable materials, such as silver or copper. In an embodiment in which the connectors 603 are tin solder bumps, the connectors 603 may be formed by initially forming a layer of tin through any suitable method such as evaporation, electroplating, printing, solder transfer, ball placement, etc., to a preferred thickness of about 100 µm. Once a layer of tin has been formed above the structure, a reflow may be performed in order to shape the material into the desired bump shape.

The underfill 571 may be used between the die 601 and the device 301 to strengthen the attachment of the die 601 to the device 301 and to prevent the thermal stresses from breaking the connections between the die 601 and the device 301. Generally, the material for the underfill 571, such as organic resin, is selected to control the coefficient of thermal expansion and the shrinkage of underfill 571. Initially, liquid organic resin is applied that flows into the gap between the die 601 and the surface of the device 301, which subsequently cures to control the shrinkage that occurs in underfill during curing.

The micro-bump layer may comprise the micro-bump 485, and the micro-bump line 470, where the micro-bump 485 is used to connect to other die such as the die 601, and the micro-bump line 470 is a part of the transmission line 490. The micro-bump line 470, and the micro-bump 485 may be formed at the same time with little or no additional cost, may be of a similar height, and may be made of similar materials. The height of the micro-bump layer may be defined by the height of the micro-bump 485, which may depend on the technology used in the package. For example, for current technology, the height of the micro-bump layer may be within the range of about 10 μm to about 50 μm, such as about 27 μm.

The micro-bump 485 may comprise a solder bump 471 formed above a Cu layer 475. An optional Ni layer 473 may be in between the solder bump 471 and the Cu layer 475. The solder bump 471 may comprise an electrically conductive solder material, e.g., Sn, Ni, Au, Ag, Cu, bismuthinite (Bi) and alloys thereof, or combinations of other electrically conductive material. For example, the solder bump 471 may be a Cu/SnAg solder bump. The micro-bump 485 may be formed by initially forming a Cu layer 475 through methods such as sputtering, evaporation, electroplating, printing, solder transfer, or ball placement, to a thickness of, e.g., about 15 μm, followed by forming a Ni layer 473, and finally followed by forming a solder layer 471 such as lead-free solder SnAg, formed in sequence using the same or similar method for each layer. Then a reflow is performed in order to shape the solder layer 471 into the desired bump shape shown as the solder bump 471. Any suitable method of producing the micro-bump 485 may alternatively be utilized. For example, the micro-bump 485 may be manufactured using the Controlled Collapse Chip Connection New Process (C4NP).

The micro-bump 485 may be placed on an UBM pad 391 of the device 301, sometimes referred to herein as a contact pad. The UBM pad 391 may fill an opening or partially filling an opening of an insulator layer such as an insulator layer 371. The UBM pad 391 may be further connected to a metal layer such as a RDL 489 or a contact pad 321 under the UBM pad 489 within the device 301. The micro-bump 485 may be of a height size from about 10 μm to about 50 μm. With the continuous reduction of feature sizes and package sizes, the sizes in embodiments may become smaller than the ones described above. On the other hand, the micro-bump 485 may be of a bigger size such as a size of a flip-chip bump or a package bump as well, depending on the particular applications of interest.

The micro-bump line 470 may be made of substantially similar materials as the materials used for the micro-bump 485. The micro-bump line 470 may be placed on the UBM line 390, which is in parallel to the RDL 480. The RDL 480, the micro-bump line 470 separated from the RDL 480 by the insulator layer 371, and the UBM line 390 under the micro-bump line 470 form the transmission line 490, where the RDL 480 is the ground plane, while the micro-bump line 470 and the UBM line 390 form the signal transmission line.

As illustrated in FIG. 1(a), the micro-bump line 470, which is a part of the signal transmission line, may comprise multiple layers: the layer 475 above the UBM line 390 may be a layer of Cu, the layer 473 above the layer 475 may be a layer of Ni, and the layer 471 above the layer 473 may be a layer of lead free solder such as SnAg. On the other hand, the micro-bump line 470 may be of two layers only, the layer 475 above the UBM line 390 may be a layer of Cu, and the layer 471 may be a layer of lead free solder such as SnAg, without the layer 473 of Ni. The layer 471 may be a lead free solder layer made of SnAg, with Ag from about 1% to about 2%, and Sn from about 99% to about 98%. The height of the three layers 471, 473, and 475 may be about the same, or different, which can be varied according to different requirement. For example, a ratio of the heights for the layers 475 of Cu, 473 of Ni, and 471 of lead free solder may be around 15/1.5/10, The total height of the micro-bump line 470 may be within a range from about 10 μm to about 50 μm, e.g., 27 μm. In some alternative embodiments, the signal transmission line 470 and the ground plane 480 may have a thickness of about 0.5-2 microns.

The micro-bump line 470 may be of a rectangle shape with a width from around 10 μm to about 100 μm. The micro-bump line 470 may have a narrow, wide, or tapered shape. The body of the micro-bump line 470 may be of a substantially constant thickness. The micro-bump line 470 may be of other shapes such as a circle, an octagon, a rectangle, an elongated hexagon with two trapezoids on opposite ends of the elongated hexagon, an oval, a diamond, in top views.

In some embodiments, it is desirable for performance of the transmission line 490 that width of the ground plane line 480 to be about 1.5 times width of signal transmission line, which is the width of the micro-bump line 470. For better performance, it is further desirable that the width of the ground plane line 480 to be approximately 2 times width of signal transmission line 470 in some embodiments. Furthermore, the width is dependent on the distance between the ground plane line 480 and the signal transmission line 470, which is filled by insulator layer 371, or some other dielectric layer or substrate. As the distance between the ground plane line 480 and the signal transmission line 470 increases, the corresponding width of the signal transmission line 470 increases. In some embodiment, the width of the signal transmission line 470 may ideally be approximately 27.6 microns for a distance between the ground plane line 480 and the signal transmission line 470 of 20 microns.

Figure 1B:
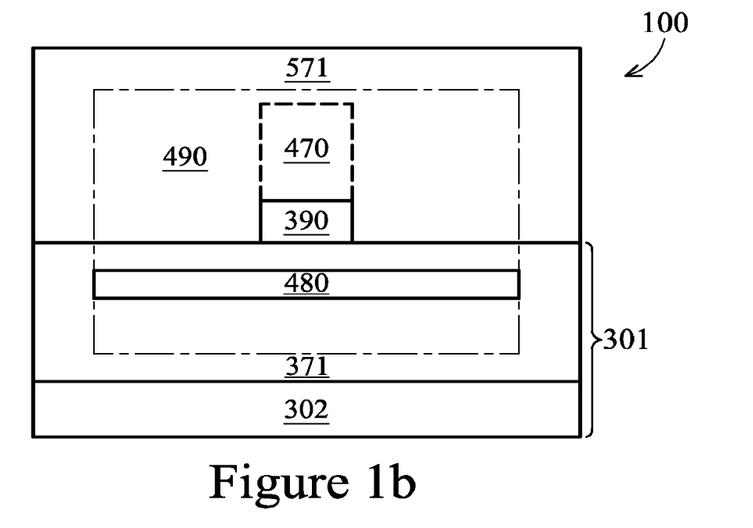
Figure 1C:
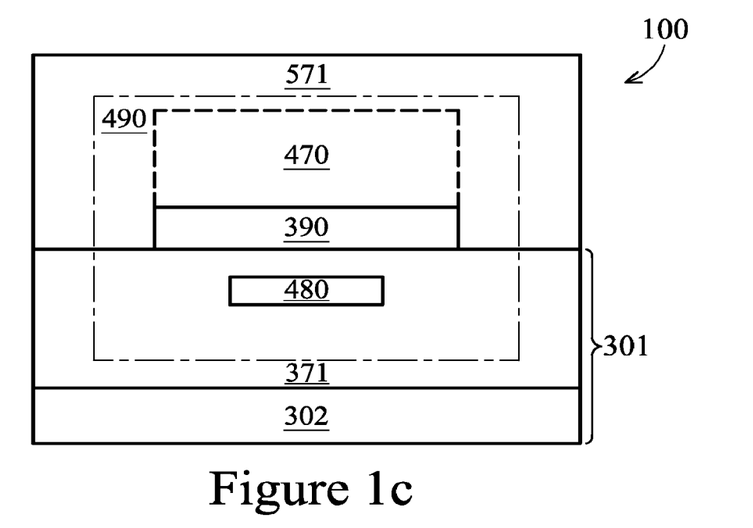
Figure 1D:
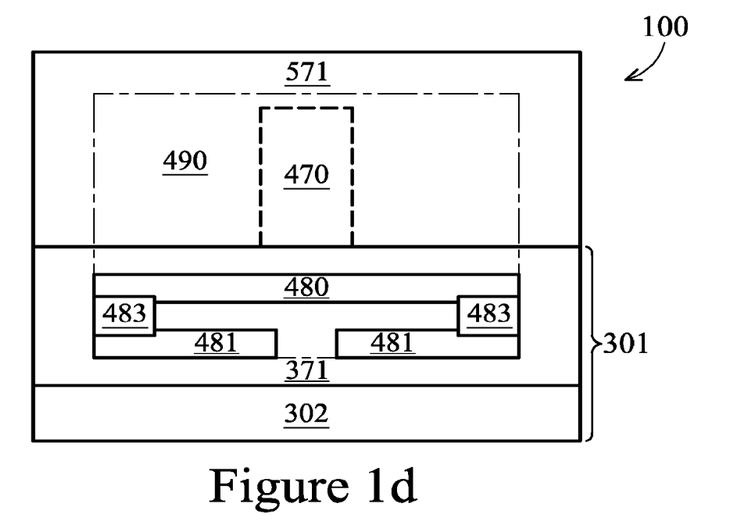
Figure 1E:
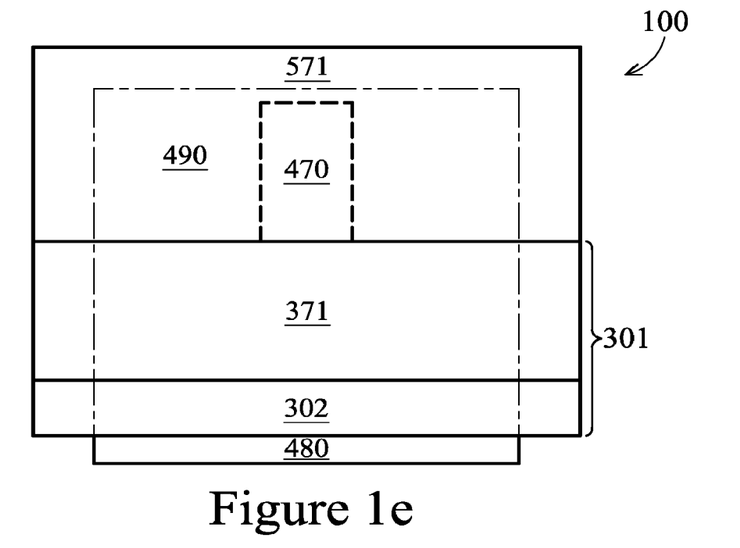
Figure 1F:
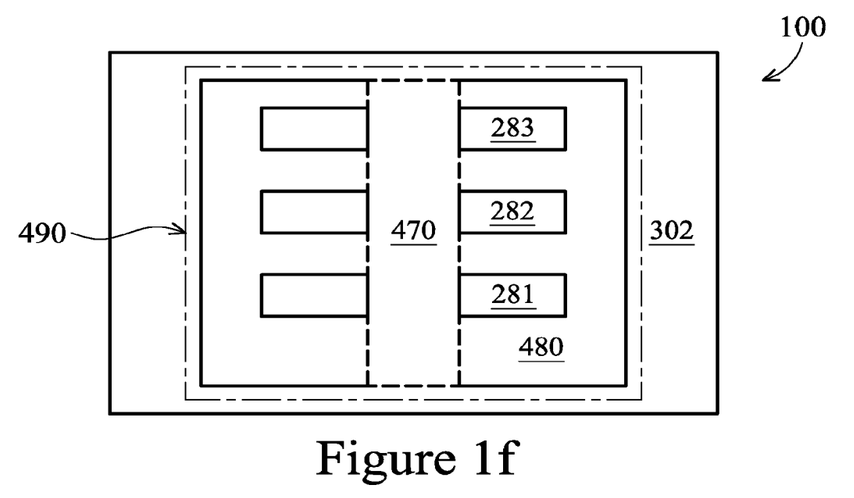

A simplified view of the package 100 in FIG. 1(a) is shown in FIG. 1(b). As illustrated in FIG. 1(b), the package 100 is formed on a device 301. The device 301 comprises a substrate 302, an insulator layer 371 on the substrate 302, a redistribution layer (RDL) 480 within the device 301, and an UBM line 390 on the insulator layer 371. A micro-bump line 470 may be formed above the device 301 and in contact with the UBM line 390. The RDL 480, the micro-bump line 470 separated from the RDL 480 by the insulator layer 371, and the UBM line 390 under the micro-bump line 470 form the transmission line 490, where the RDL 480 is the ground plane, while the micro-bump line 470 and the UBM line 390 form the signal transmission line. Alternatively, the RDL 480 may be the signal transmission line while the micro-bump line 470 and the UBM line 390 form the ground plane, as shown in FIG. 1(c). An underfill 571 may cover the micro-bump line 470 and the UBM line 390. There may be a die placed above the device 301 and above the underfill 571, connected to micro-bumps by connectors, which are not shown in FIG. 1(*b*). The package 100 shown in FIG. 1(*b*) is a simplified view and there may be other layers within the package 100 not shown. For example, there may be more layers under the RDL 480, such as copper metal layers with low-K inter-metal dielectric (IMD) layers, passivation layers, and so on.

Another embodiment of the transmission line 490 is shown in FIG. 1(*d*) in a similar fashion. As illustrated in FIG. 1(*d*), the package 100 is formed on a device 301. The device 301 comprises a substrate 302 and an insulator layer 371 on the substrate 302. The device 301 further comprises a first RDL 480 and a second RDL 481 within the insulator layer 371 and above the substrate 302. The first RDL 480 and the second RDL 481 are connected by vias 483. A micro-bump line 470 may be formed above the device 301. There is no UBM line under the micro-bump line 470 in this embodiment. An underfill 571 may cover the micro-bump line 470. There may be a die placed above the device 301 and above the underfill 571, connected to micro-bumps by connectors, which are not shown in FIG. 1(*d*). The RDLs 480 and 481 and the micro-bump line 470 separated from the RDLs 480 and 481 by the insulator layer 371 form the transmission line 490, where the RDLs 480 and 481 are the ground plane, while the micro-bump line 470 is the signal transmission line. Alternatively, the second RDL 481 may be some other metal layer, instead of a second RDL. For example, there could be a Cu metal layer 481 with a width in a range from about 0.1 um to about 3.5 um, connected to the RDL 480 and forming the ground plane together, while the micro-bump line 470 is the signal transmission line. Details of each component of FIG. 1(*d*) may be substantially the same as those described for FIG. 1(*a*).

Another embodiment of the transmission line 490 is shown in FIG. 1(*e*). As illustrated in FIG. 1(*e*), the package 100 is formed on a device 301. The device 301 comprises a substrate 302 and an insulator layer 371, where the insulator layer 371 is at a first side of the substrate 302. The device 301 further comprises a RDL 480 at a second side of the substrate 302 opposite to the first side. A micro-bump line 470 may be formed above the device 301. The micro-bump line 470 may be in contact with the insulator layer 371. Alternatively, the micro-bump line 470 may be above the insulator layer 371 and not in contact with the insulator layer 371. There is no UBM line under the micro-bump line 470 in this embodiment. Alternatively, an UBM line may be formed under the micro-bump line 470. An underfill 571 may cover the micro-bump line 470. There may be a die placed above the device 301 and above the underfill 571, connected to micro-bumps by connectors, which are not shown in FIG. 1(*e*). The RDL 480, and the micro-bump line 470 separated from the RDL 480 by the insulator layer 371 and the substrate 302 form the transmission line 490, where the RDL 480 is the ground plane, while the micro-bump line 470 is the signal transmission line. Details of each component of FIG. 1(*e*) may be substantially the same as those described for FIG. 1(*a*).

Another embodiment of the transmission line 490 is shown in FIG. 1(*f*) in a top view. As illustrated in FIG. 1(*f*), the package 100 may be formed on a substrate 302 which may be a substrate for a device. A redistribution layer (RDL) 480 may be formed on the substrate 302, and within an insulator layer not shown. A micro-bump line 470 may be formed above the RDL 480. The RDL 480, the micro-bump line 470 separated from the RDL 480 by an insulator layer form the transmission line 490, where the RDL 480 is the ground plane, while the micro-bump line 470 is the signal transmission line. The RDL 480 comprises one or a plurality of open slots 281, 282, and 283. The open slots 281, 282, and 283 can slow the wave, and reduce the length needed for the RDL 480 to achieve desired performance. There may be only one open slot, or any other number of open slots rather than the three open slots showing in FIG. 1(*f*). Details of each component of FIG. 1(*f*) may be substantially the same as those described for FIG. 1(*a*).

Microstrip transmission lines shown in FIGS. 1(*a*)-1(*f*) are merely one kind of transmission lines. FIGS. 2(*a*)-2(*e*) illustrate cross-sectional views and a three dimensional view of coplanar waveguide (CPW) transmission lines formed within a package using a micro-bump layer, in accordance with some additional embodiments. A coplanar waveguide (CPW) transmission line is formed by a signal transmission line separated from a pair of ground planes, all on the same plane, atop a dielectric medium.

As illustrated in FIGS. 2(*a*) and 2(*b*), the package 100 comprising a CPW transmission line 490 may be formed on a device 301. The device 301 comprises a substrate 302 and an insulator layer 371 on the substrate 302. There may be other layers of the device 301 not shown, such as the passivation layer, and contacts. A micro-bump layer comprising micro-bump lines 470, 484, and 482 are formed above the device 301. The micro-bump lines 470, 484, and 482 may be in contact with the insulator layer 371. Alternatively, the micro-bump lines 470, 484, and 482 may be above the insulator layer 371 and not in contact with the insulator layer 371. There is no UBM line under the micro-bump line 470 in the embodiment shown in FIG. 2(*a*). Alternatively, an UBM line 390 may be formed under the micro-bump lines 470, 484, and 482, as shown in FIG. 2(*b*). An underfill 571 may cover the micro-bump lines 470, 484, and 482. There may be a die placed above the device 301 and above the underfill 571, connected to micro-bumps by connectors, which are not shown in FIGS. 2(*a*) and 2(*b*).

As shown in FIG. 2(*a*), the micro-bump lines 470, 484, and 482 form the transmission line 490, where the micro-bump lines 484 and 482 are a pair of ground planes, while the micro-bump line 470 is the signal transmission line. As shown in FIG. 2(*b*), the micro-bump lines 470, 484, and 482 and the UBM line 390 connected to each of the micro-bump lines form the transmission line 490, where the micro-bump lines 484 and 482 and their connected UBM lines 390 are a pair of ground planes, while the micro-bump line 470 and its connected UBM line 390 is the signal transmission line. The micro-bump lines 470, 484, and 482 are all on the same plane, atop a dielectric medium such as the insulator layer 371 and separated by the underfill 571. Details of each component of FIGS. 2(*a*)-2(*b*) may be substantially the same as those described for FIG. 1(*a*).

Alternatively, as shown in FIG. 2(*c*), for the package 100, some additional RDL 480 may be formed within the device 301 and connected to the micro-bump lines 470, 484, and 482 to form the transmission line 490. The micro-bump lines 484 and 482 with the connected RDLs 480 are a pair of ground planes, while the micro-bump line 470 with the connected RDL 480 is the signal transmission line. The micro-bump lines 470, 484, and 482 and the connected RDLs 480 are all on the same plane, atop a dielectric medium such as the insulator layer 371 and separated by the underfill 571 and the insulator layer 371. Details of each component of FIG. 2(*c*) may be substantially the same as those described for FIGS. 2(*a*)-2(*b*) and FIG. 1(*a*).

Alternatively, as shown in FIG. 2(*d*), the package 100 further comprises a second device 601 above the micro-bump lines 470, 484, and 482, and above the underfill 571. The second device 601 comprises a substrate 302 and an insulator layer 371 as well. A RDL 4801 is connected to each of the micro-bump lines 470, 484, and 482 in the device 601. A RDL 4802 is connected to each of the micro-bump lines 470, 484, and 482 in the device 301. The transmission line 490 is formed by the RDLs 4801 and 4802 together with the micro-bump lines 470, 482, and 484 between the devices 301 and 601. The micro-bump lines 484 and 482 with the connected RDLs 4801 and 4802 are a pair of ground planes, while the micro-bump line 470 with the connected RDLs 4801 and 4802 is the signal transmission line. The micro-bump lines 470, 484, and 482 and the connected RDLs 4801 and 4802 are all on the same plane, atop a dielectric medium such as an insulator layer 371 and separated by the underfill 571 and the insulator layer 371. Details of each component of FIG. 2(*d*) may be substantially the same as those described for FIGS. 2(*a*)-2(*b*) and FIG. 1(*a*).

Figure 2A:
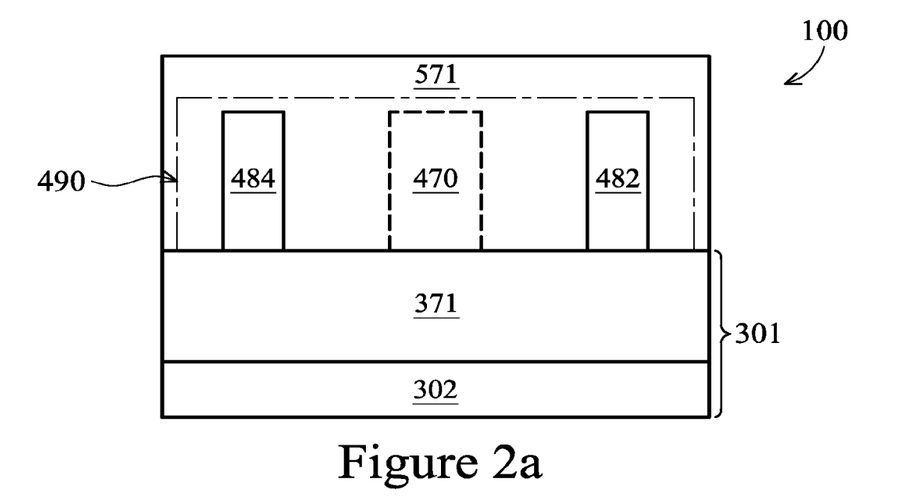
Figure 2B:
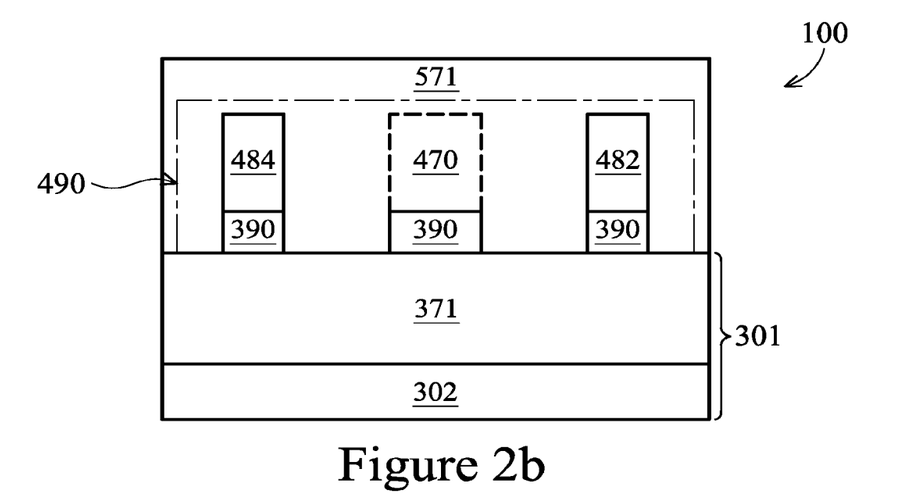
Figure 2C:
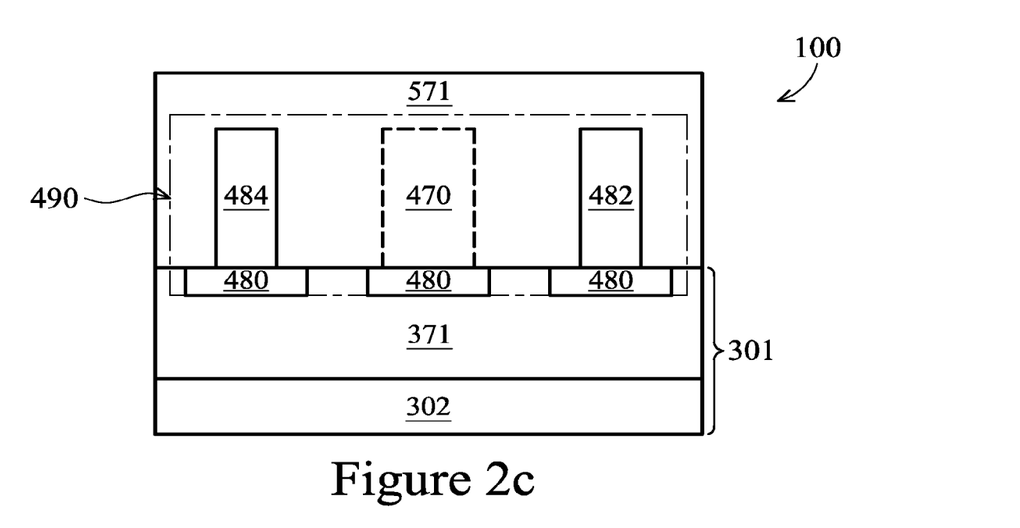
Figure 2D:
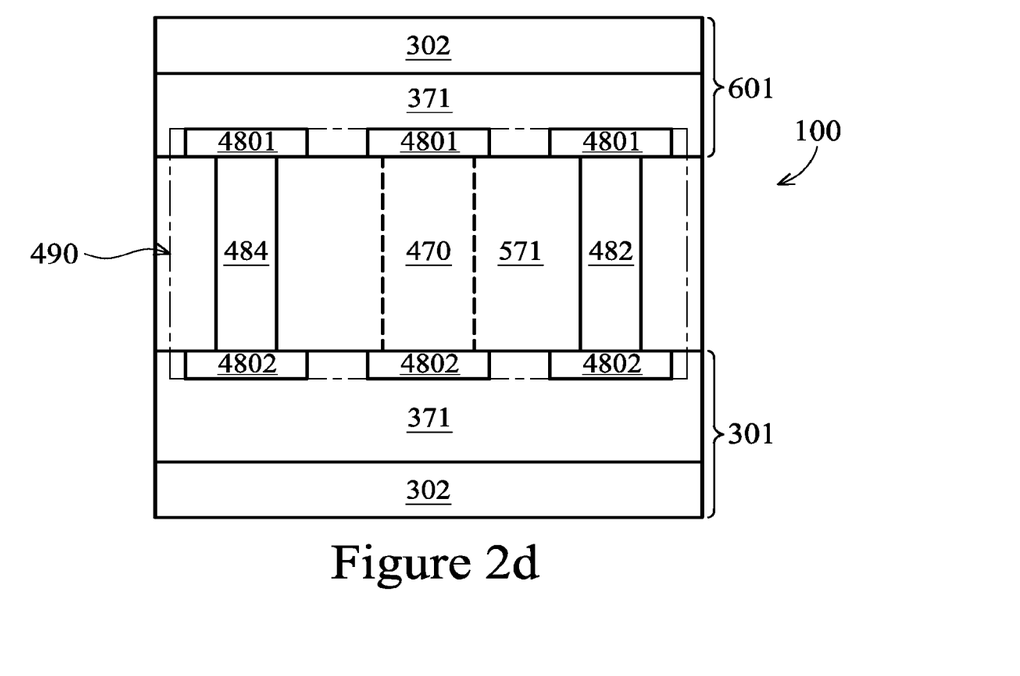
Figure 2E:
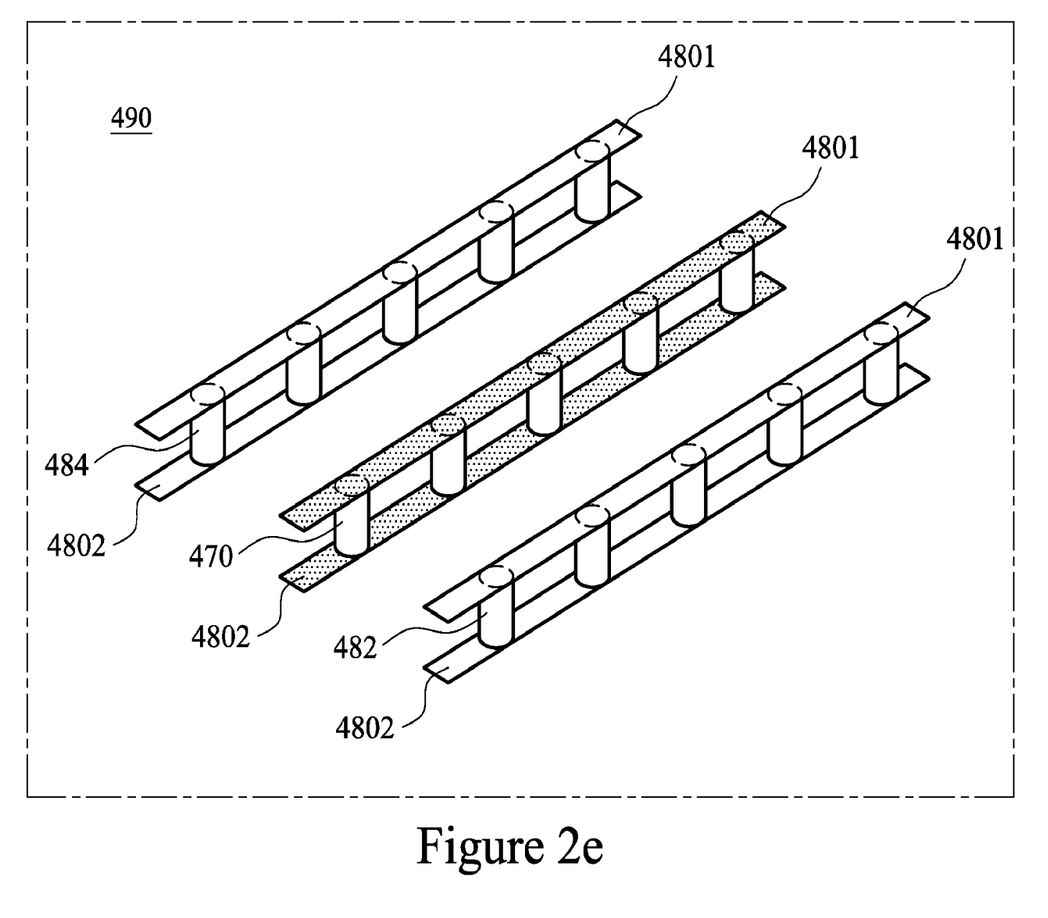
Figure 3A:
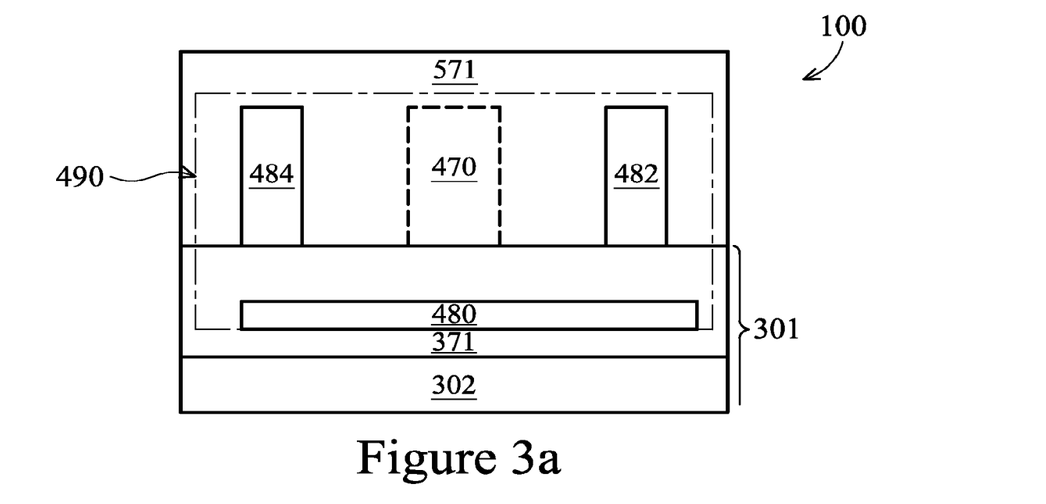
Figure 3B:
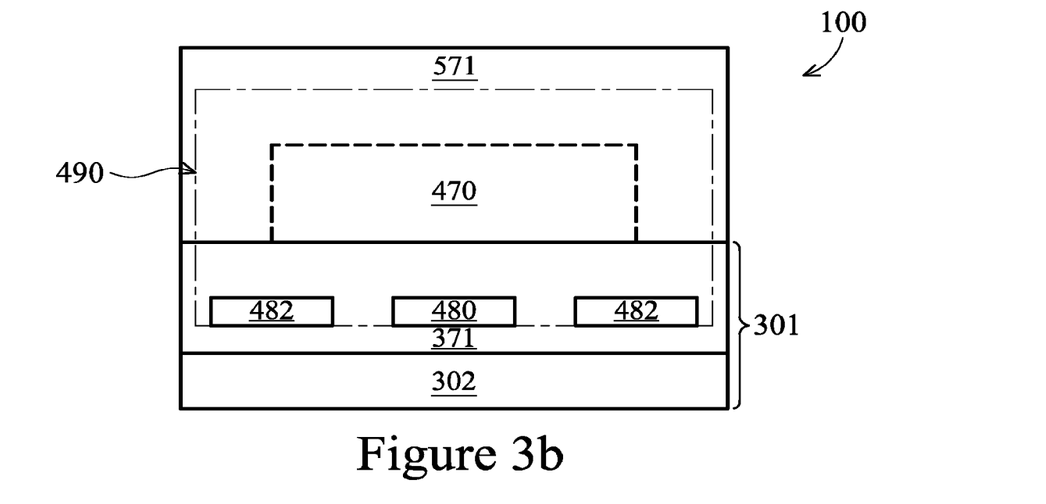
Figure 3C:
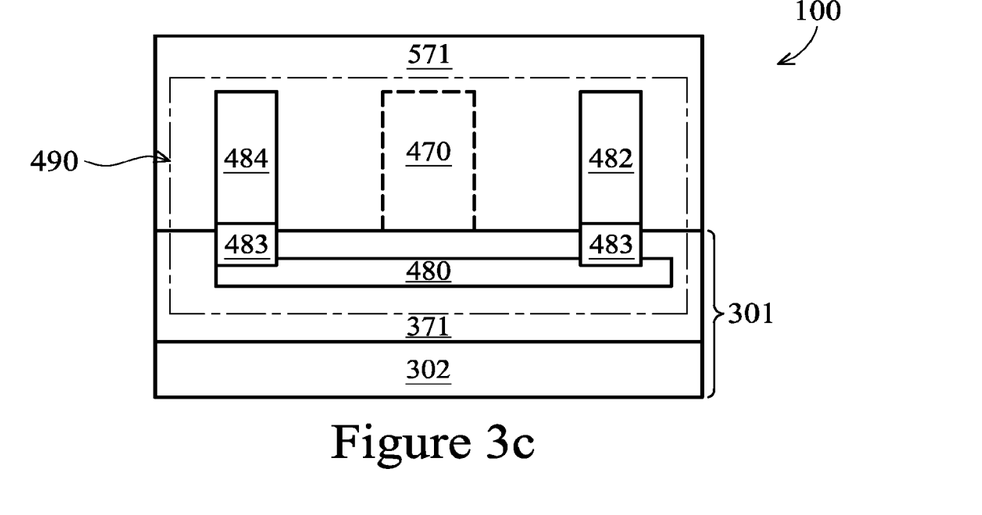
Figure 3D:
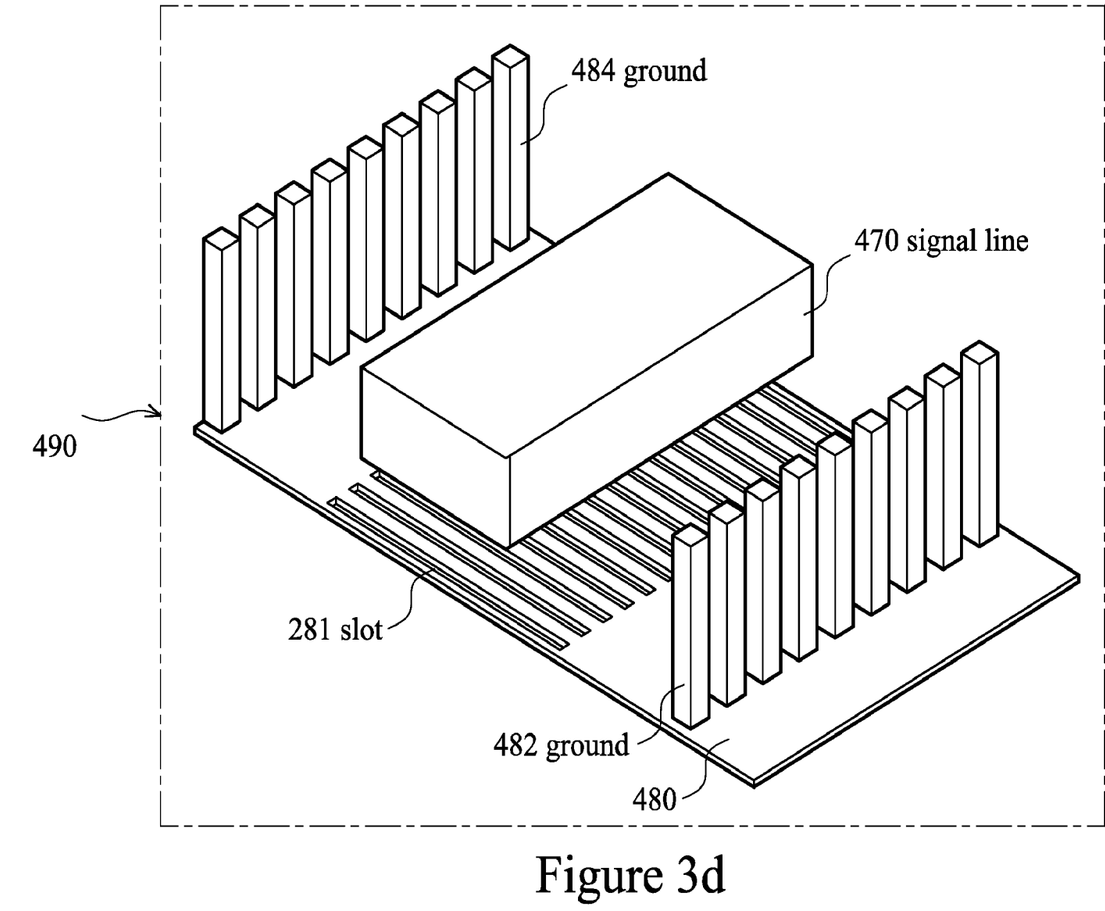

The device 301 and device 601 may comprise a substrate 302 and an insulator layer 371 on the substrate 302. There may be other layers of the device 301 and the device 601 not shown, such as the passivation layer, UBM layer, and contacts. The micro-bump lines 470, 484, and 482 are formed above the device 301 as one micro-bump layer. The device 301 may be an interposer, a part of a chip or an integrated circuit (IC) die, which may be the back or front side of a die, or a package substrate. Similarly, the device 601 may be an interposer, a part of a chip or an integrated circuit (IC) die, which may be the back or front side of a die, or a package substrate. These devices and any other suitable devices may alternatively be used and are fully intended to be included within the scope of the present embodiments.

Another embodiment of the transmission line 490 is shown in FIG. 2(*e*) in a three-dimensional view. The transmission line 490 shown in FIG. 2(*e*) may have the cross sectional view as shown in FIG. 2(*d*) at some cross section points. The RDLs 4801 may be RDL lines spread out in the insulator layer of the top device 601 in FIG. 2(*d*), and the RDLs 4802 may be RDL lines spread out in the insulator layer of the bottom device 301 in FIG. 2(*d*). There may be a plurality of micro-bump lines 470, 482, and 484 connected to the RDL lines 4801 and 4802. The plurality of micro-bump lines 484 and 482 with the connected RDLs 4801 and 4802 are a pair of ground planes, while the plurality of micro-bump line 470 with the connected RDLs 4801 and 4802 are the signal transmission line. The plurality of micro-bump lines 470, 484, and 482 and the connected RDLs 4801 and 4802 are all on the same plane, atop a dielectric medium such as an insulator layer 371 and separated by the underfill 571 and the insulator layer 371 as shown in FIG. 2(*d*).

A variant of CPW transmission line is formed when a ground plane is provided on the opposite side of the dielectric, which is called a finite ground-plane coplanar waveguide (FGCPW) transmission line, or more simply, a grounded coplanar waveguide (GCPW) transmission line. FIGS. 3(*a*)-3(*d*) illustrate cross-sectional views and a three dimensional view of GCPW transmission lines formed within a package using a micro-bump layer, in accordance with some embodiment.

As illustrated in FIG. 3(*a*), the package 100 comprising a GCPW transmission line 490 may be formed on a device 301. The device 301 comprises a substrate 302 and an insulator layer 371 on the substrate 302. A RDL 480 is within the device 301. There may be other layers of the device 301 not shown, such as the copper metal layers with low-K inter-metal dielectric (IMD) layer, passivation layer, UBM layer, and contacts. A micro-bump layer comprising micro-bump lines 470, 484, and 482 are formed above the device 301. The micro-bump lines 470, 484, and 482 may be in contact with the insulator layer 371. Alternatively, the micro-bump lines 470, 484, and 482 may be above the insulator layer 371 and not in contact with the insulator layer 371. There is no UBM line under the micro-bump line 470 in this embodiment. Alternatively, an UBM line may be formed under the micro-bump lines 470, 484, and 482. An underfill 571 may cover the micro-bump lines 470, 484, and 482. There may be a die placed above the device 301 and above the underfill 571, connected to micro-bumps by connectors, which are not shown in FIG. 3(*a*).

The micro-bump lines 470, 484, and 482 and the RDL 480 form the GCPW transmission line 490, where the micro-bump lines 484 and 482 are a pair of ground planes, the RDL 480 is a third ground plane, while the micro-bump line 470 is the signal transmission line. The micro-bump lines 470, 484, and 482 are all on the same plane, atop a dielectric medium such as the insulator layer 371 and separated by the underfill 571. Alternatively, as shown in FIG. 3(*b*), there may be multiple RDL segments 480, 482, and 484 formed within the device 301 and a micro-bump line 470 formed above the device 301, while the RDLs 480, 482, and 484 are the signal transmission lines, and the micro-bump line 470 is the ground plane. Details of each component of FIGS. 3(*a*) and 3(*b*) may be substantially the same as those described for FIGS. 2(*a*) and 1(*a*).

Alternatively, as shown in FIG. 3(*c*), the ground plane RDL 480 may be connected by vias 483 to the micro-bump lines 484, and 482, which are also ground planes, to form the ground plane for the GCPW transmission line 490. The micro-bump line 470 is still the signal transmission line. The micro-bump lines 470, 484, and 482 are all on the same plane, atop a dielectric medium such as the insulator layer 371 and separated by the underfill 571 and the insulator layer 371. Details of each component of FIG. 3(*c*) may be substantially the same as those described for FIGS. 1(*a*), 2(*a*), and 3(*a*).

Alternatively, a three dimensional view of the GCPW transmission line 490 of FIG. 3(*c*) may be shown in FIG. 3(*d*). The RDL 480 may be contained within the device 301 shown in FIG. 3(*c*), and connected to the micro-bump lines 484 and 482 at the micro-bump layer. The RDL 480 and the connected micro-bump lines 484 and 482, and the micro-bump line 470 separated from the RDL 480 by an insulator layer form the GCPW transmission line 490, where the RDL 480 and the micro-bump lines 484 and 482 are the ground plane, while the micro-bump line 470 is the signal transmission line. The RDL 480 comprises one or a plurality of open slots 281. The open slots 281 can slow the wave, and reduce the length needed for the RDL 480 to achieve desired performance. There may be only one open slot, or any other number of open slots rather than the number of open slots showing in FIG. 3(*d*). Details of each component of FIG. 3(*d*) may substantially the same as those described for FIGS. 1(*a*), 2(*a*), and 3(*a*).

In an embodiment, a device is provided. The device includes a first substrate, a first insulator layer over the first substrate, a redistribution layer over the first insulator layer, the redistribution layer comprising a first redistribution line and a second redistribution line, a second insulator layer over the redistribution layer, and a micro-bump layer over the second insulator layer, the micro-bump layer comprising a micro-bump line and a micro-bump structure, wherein the micro-bump line is laterally above the first redistribution line and the micro-bump structure contacts the second redistribution line, wherein the micro-bump line and the micro-bump structure comprise a same one or more layers. A second substrate is coupled to the micro-bump structure, and an underfill is interposed between the second insulator layer and the second substrate, the underfill completely separating the micro-bump line and the second substrate.

In an embodiment, a method of forming a semiconductor device is provided. The method includes forming a first redistribution layer over a first substrate, the first redistribution layer comprising a first redistribution line and forming a first insulator layer over the first redistribution layer. A first micro-bump line, a second micro-bump line, a third micro-bump line, and a micro-bump are formed, wherein the first micro-bump line, the second micro-bump line, and the third micro-bump line extend over the first insulator layer, wherein the micro-bump extends through an opening in the first insulator layer to the first redistribution line, wherein the first micro-bump line, the second micro-bump line, the third micro-bump line, and the micro-bump comprise same layers of same materials, wherein the second micro-bump line is interposed between the first micro-bump line and the third micro-bump line, the first micro-bump line and the third micro-bump line being coupled to ground, the second micro-bump line being a signal transmission line.

In an embodiment, a method of forming a semiconductor device is provided. The method includes forming a first insulator layer over a first substrate, forming a first redistribution layer over the first insulator layer, the first redistribution layer comprising a first redistribution line and a second redistribution line, forming a second insulator layer over the redistribution layer, and forming an opening in the second insulator layer, the opening exposing the second redistribution line. A micro-bump line and a micro-bump connector are simultaneously formed, wherein the micro-bump line extends over the first redistribution line in a plan view and the micro-bump connector extends through the opening to the second redistribution line.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
forming a first insulator layer over a first substrate;
forming a redistribution layer over the first insulator layer, the redistribution layer comprising a first redistribution line and a second redistribution line;
forming a second insulator layer over the redistribution layer;
forming a micro-bump layer over the second insulator layer, forming the micro-bump layer comprising simultaneously forming a micro-bump line and a micro-bump structure, wherein the micro-bump line is laterally above the first redistribution line and the micro-bump structure contacts the second redistribution line, wherein the micro-bump line and the micro-bump structure comprise a same one or more layers, wherein the micro-bump line and the micro-bump structure each comprise a layer of solder material, wherein the micro-bump line is a signal transmission line coupled to transmit a signal horizontally over a surface of the second insulator layer;
attaching a second substrate to the micro-bump structure; and
forming an underfill interposed between the second insulator layer and the second substrate, the underfill completely separating the micro-bump line and the second substrate.

2. The method of claim 1, wherein the redistribution layer comprises a plurality of slots.

3. The method of claim 1, wherein the micro-bump line extends laterally past opposing sidewalls of the first redistribution line in a cross-sectional view.

4. The method of claim 1, wherein the first redistribution line extends laterally past opposing sidewalls of the micro-bump line in a cross-sectional view, wherein the opposing sidewalls of the micro-bump line are at a widest width of the micro-bump line in the cross-sectional view.

5. The method of claim 1, wherein the first redistribution line and the micro-bump line form a transmission line.

6. The method of claim 5, wherein the first redistribution line is a ground plane.

7. The method of claim 1, further comprising a first under bump metal (UBM) line and a second UBM line, wherein the first UBM line is interposed between the micro-bump line and the second insulator layer, wherein the second UBM line electrically couples the micro-bump structure to the second redistribution line.

8. The method of claim 1, further comprising a plurality of through vias extending through the first substrate.

9. A method comprising:
forming a first insulator layer over a first substrate, the first substrate having a redistribution line;
forming a micro-bump layer over the first insulator layer, the micro-bump layer comprising a first micro-bump line and a micro-bump structure, wherein the first insulator layer is interposed between the redistribution line and the first micro-bump line, each of the first micro-bump line and the micro-bump structure comprising one or more metallic layers and a solder layer on the one or more metallic layers, wherein the one or more metallic layers is interposed between the solder layer and the first insulator layer;
bonding a second substrate to the micro-bump structure by the solder layer of the micro-bump structure; and
placing an underfill between the first micro-bump line and the second substrate, the underfill completely separating the first micro-bump line and the second substrate.

10. The method of claim 9, wherein forming the micro-bump layer further comprises:
forming a first via and a second via to the redistribution line; and
forming a second micro-bump line coupled to the first via and forming a third micro-bump line coupled to the second via, wherein the first micro-bump line is interposed between the second micro-bump line and the third micro-bump line.

11. The method of claim 9, further comprising forming the redistribution line, wherein the redistribution line comprises a plurality of slots.

12. The method of claim 9, wherein the first micro-bump line comprises a first layer, a second layer and a third layer, wherein a ratio of heights for the first layer/the second layer/the third layer is 15/1.5/10.

13. The method of claim 9, wherein a narrower one of the first micro-bump line and the redistribution line is a signal transmission line and a wider one of the first micro-bump line and the redistribution line is a ground plane, wherein a width of the ground plane is 1.5 times to 2 times a width of the signal transmission line.

14. The method of claim 9, wherein the first insulator layer completely covers a lower surface of the first micro-bump line.

15. A method comprising:
forming a redistribution line on a first substrate;
a first insulator layer over the redistribution line;
forming one or more micro-bump lines over the first insulator layer;
forming a micro-bump structure, wherein each of the one or more micro-bump lines and the micro-bump structure have a same conductive layer structure, wherein the conductive layer structure of both the one or more micro-bump lines and the micro-bump structure comprises a solder layer and one or more metal layers between the solder layer and the first insulator layer, wherein the one or more micro-bump lines are electrically coupled to ground or a signal line;
attaching a second substrate to the micro-bump structure by the solder layer of the micro-bump structure; and
placing an underfill between the one or more micro-bump lines and the second substrate, wherein the underfill extends closer to the second substrate than the one or more micro-bump lines.

16. The method of claim 15, wherein the one or more micro-bump lines comprises a first micro-bump line, a second micro-bump line, and a third micro-bump line, wherein the first micro-bump line is interposed between the second micro-bump line and the third micro-bump line, wherein the second micro-bump line and the third micro-bump line are electrically coupled to the redistribution line.

17. The method of claim 15, wherein the first substrate is part of an interposer.

18. The method of claim 15, wherein the first substrate is part of an integrated circuit die.

19. The method of claim 15, wherein the first insulator layer has a thickness between 5 μm and 30 μm.

20. The method of claim 15, wherein a height of the micro-bump structure is between 10 μm to 50 μm.

* * * * *